United States Patent
Liu et al.

(10) Patent No.: US 12,354,992 B2
(45) Date of Patent: *Jul. 8, 2025

(54) FIRST LAYER INTERCONNECT FIRST ON CARRIER APPROACH FOR EMIB PATCH

(71) Applicant: Intel Corporation, Santa Clara, CA (US)

(72) Inventors: Changhua Liu, Chandler, AZ (US); Xiaoying Guo, Phoenix, AZ (US); Aleksandar Aleksov, Chandler, AZ (US); Steve S. Cho, Chandler, AZ (US); Leonel Arana, Phoenix, AZ (US); Robert May, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,296

(22) Filed: Sep. 30, 2022

(65) Prior Publication Data

US 2023/0027030 A1    Jan. 26, 2023

Related U.S. Application Data

(63) Continuation of application No. 17/366,469, filed on Jul. 2, 2021, which is a continuation of application
(Continued)

(51) Int. Cl.
*H01L 23/00*    (2006.01)

(52) U.S. Cl.
CPC .............. *H01L 24/20* (2013.01); *H01L 24/11* (2013.01); *H01L 24/13* (2013.01); *H01L 24/19* (2013.01);
(Continued)

(58) Field of Classification Search
CPC ......... H01L 24/20; H01L 24/19; H01L 25/18; H01L 25/0655; H01L 25/50; H01L 23/5384
See application file for complete search history.

(56) References Cited

U.S. PATENT DOCUMENTS 9,374,896 B2    6/2016  Chen
9,607,967 B1 *  3/2017  Shih ..................... H01L 21/6835
(Continued)

OTHER PUBLICATIONS

International Search Report and Written Opinion for International Patent Application No. PCT/US2018/013620 mailed Oct. 12, 2018, 15 pgs.
(Continued)

*Primary Examiner* — Bac H Au
(74) *Attorney, Agent, or Firm* — Schwabe, Williamson & Wyatt, P.C.

(57) ABSTRACT

A patch structure of an integrated circuit package comprises a core having a first side facing downwards and a second side facing upwards. A first solder resist (SR) layer is formed on the first side of the core, wherein the first SR layer comprises a first layer interconnect (FLI) and has a first set of one or more microbumps thereon to bond to one or more logic die. A second solder resist (SR) layer is formed on the second side of the core, wherein the second SR layer has a second set of one or more microbumps thereon to bond with a substrate. One or more bridge dies includes a respective sets of bumps, wherein the one or more bridge dies is disposed flipped over within the core such that the respective sets of bumps face downward and connect to the first set of one or more microbumps in the FLI.

16 Claims, 7 Drawing Sheets

Related U.S. Application Data

No. 16/646,084, filed as application No. PCT/US2018/013620 on Jan. 12, 2018, now Pat. No. 11,088,103.

(52) U.S. Cl.
CPC .............. *H01L 2224/11622* (2013.01); *H01L 2224/214* (2013.01); *H01L 2224/215* (2013.01)

(56) References Cited

U.S. PATENT DOCUMENTS

| | | |
|---|---|---|
| 9,704,735 B2 | 7/2017 | Konchady |
| 9,831,148 B2 | 11/2017 | Yu |
| 10,763,239 B2 | 9/2020 | Chen |
| 10,784,202 B2* | 9/2020 | Arguin .............. H01L 23/49827 |
| 11,088,103 B2* | 8/2021 | Liu .......... H01L 24/11 |
| 2004/0056344 A1 | 3/2004 | Ogawa |
| 2012/0056316 A1 | 3/2012 | Pagaila |
| 2013/0270230 A1 | 10/2013 | Cheung et al. |
| 2014/0102772 A1 | 4/2014 | Chen et al. |
| 2014/0103488 A1 | 4/2014 | Chen |
| 2014/0185264 A1* | 7/2014 | Chen ................. H01L 23/3128 361/814 |
| 2014/0264791 A1 | 9/2014 | Manusharow |
| 2014/0299999 A1* | 10/2014 | Hu ...................... H01L 21/561 257/774 |
| 2014/0353827 A1* | 12/2014 | Liu ......... H01L 24/33 257/774 |
| 2015/0084210 A1* | 3/2015 | Chiu ..................... H01L 24/23 257/782 |
| 2015/0262958 A1 | 9/2015 | Hou et al. |
| 2016/0044786 A1 | 2/2016 | Swaminathan et al. |
| 2016/0086930 A1* | 3/2016 | Koey .................... H01L 24/20 257/773 |
| 2016/0315071 A1 | 10/2016 | Zhai |
| 2016/0329284 A1* | 11/2016 | We ..................... H01L 25/0655 |
| 2017/0162550 A1 | 6/2017 | Das |
| 2017/0170155 A1 | 6/2017 | Yu |
| 2017/0250150 A1* | 8/2017 | Konchady ........... H01L 21/6835 |
| 2017/0263518 A1* | 9/2017 | Yu ........................... H01L 24/83 |
| 2017/0345761 A1* | 11/2017 | Yu ........................... H01L 24/20 |
| 2018/0226366 A1* | 8/2018 | Kim .................... H01L 25/0655 |
| 2018/0358298 A1 | 12/2018 | Zhai |
| 2019/0157227 A1* | 5/2019 | Fillion ................ H01L 23/5389 |
| 2021/0035911 A1* | 2/2021 | Ganesan ............ H01L 23/5385 |
| 2021/0082819 A1 | 3/2021 | Wu |

OTHER PUBLICATIONS

International Preliminary Report on Patentability for International Patent Application No. PCT/US2018/013620 mailed Jul. 23, 2020, 12 pgs.

Search Report from European Patent Application No. 18899458.6, mailed Jul. 28, 2021, 13 pages.

Search Report from European Patent Application No. 23158294.1, mailed Dec. 18, 2023, 8 pages.

Office Action for U.S. Appl. No. 17/366,469 mailed Oct. 5, 2023, 11 pgs.

Office Action for U.S. Appl. No. 17/366,469 mailed Apr. 9, 2024, 12 pgs.

Office Action for U.S. Appl. No. 17/366,469 mailed Aug. 15, 2024, 15 pgs.

Final Office Action for U.S. Appl. No. 17/366,469 mailed Dec. 4, 2024, 14 pgs.

* cited by examiner

FIRST LAYER INTERCONNECT FIRST ON CARRIER APPROACH FOR EMIB PATCH

CROSS-REFERENCE TO RELATED APPLICATION

This patent application is a continuation of U.S. patent application Ser. No. 17/366,469, filed Jul. 2, 2021, which is a continuation of U.S. patent application Ser. No. 16/646,084, filed Mar. 10, 2020, now U.S. Pat. No. 11,088,103, issued Aug. 10, 2021, which is a U.S. National Phase Application under 35 U.S.C. § 371 of International Application No. PCT/US2018/013620, filed Jan. 12, 2018, entitled "FIRST LAYER INTERCONNECT FIRST ON CARRIER APPROACH FOR EMIB PATCH," which designates the United States of America, the entire disclosure of which are hereby incorporated by reference in their entirety and for all purposes.

TECHNICAL FIELD

Embodiments of the disclosure are in the field of integrated circuit structures and, in particular, first layer interconnect first on carrier approach for EMIB patch.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

Integrated circuit(s) and other electronic devices may be packaged on a semiconductor package. The semiconductor package may be integrated onto an electronic system, such as a consumer electronic system. Embedded Multi-die Interconnect Bridge (EMIB) is a cost-effective approach to in-package high density interconnect of heterogeneous chips. Instead of using a large silicon interposer typically found in other approaches, EMIB uses a very small bridge die, with multiple routing layers, that provides I/O and electrical interconnect paths between multiple die. This bridge die is embedded as part of a substrate fabrication process and there can be many embedded bridges in a single substrate. The bridge uses micro-bumps for die-to-die connections for high density signals, and coarser pitch, standard flip chip bumps for direct power and ground connections from chip to package.

Next generation EMIB substrate bump pitching is trending to be as small as 30 um to meet projected I/O density requirements. Consequently, EMIBs will have relatively stringent bump thickness variation (BTV) requirements of the first layer interconnect (FLI) for the die attach process.

DESCRIPTION OF THE EMBODIMENTS

Figure 1:
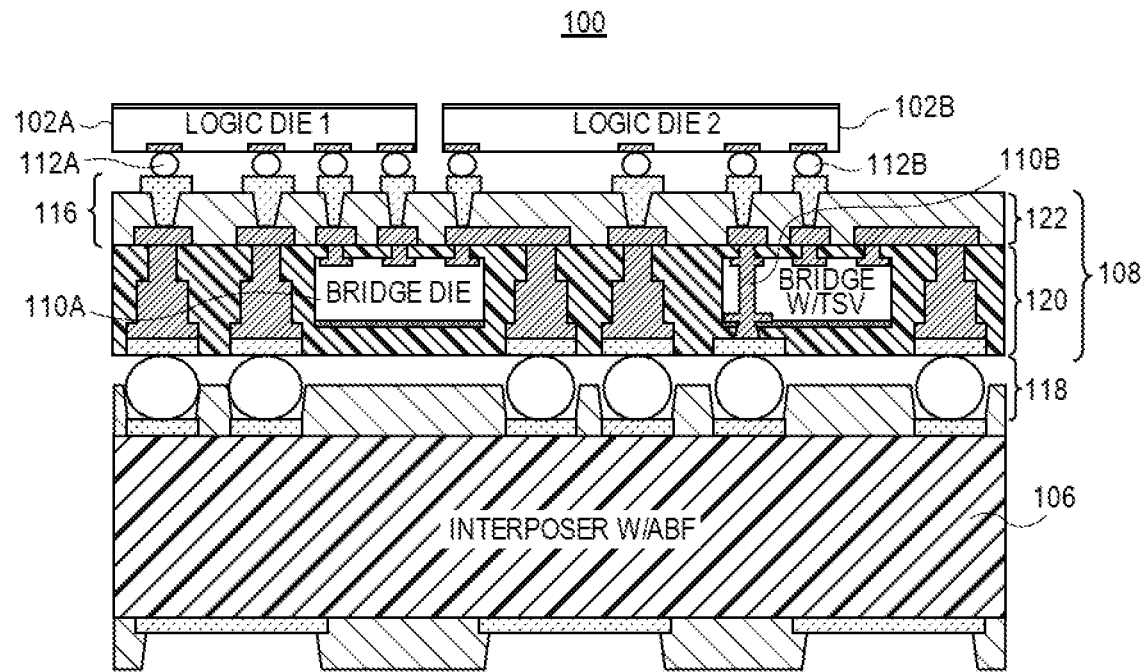
FIG. 1 depicts a simplified cross-sectional schematic diagram illustrating a state of the art semiconductor package having an embedded interconnection bridges connecting multiple dies and in accordance with example embodiments of the disclosure.

First layer interconnect first on carrier approach for EMIB patch are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments of the disclosure may provide a semiconductor package and a method for fabrication of the semiconductor package. In example embodiments, the semiconductor package may have one or more bridge dies, such as one or more embedded dies within an embedded multi-die interconnect bridge (EMIB)-based semiconductor package, as described herein. These semiconductor packages with the embedded bridge die may be fabricated using the methods as disclosed herein. The bridge die may be provided within the package substrate, such as in a cavity formed within the package substrate, to enable relatively finer (e.g., high density) interconnections between electrical components (e.g., integrated circuits) provided on the semiconductor package.

To provide context, FIG. 1 depicts a simplified cross-sectional schematic diagram illustrating a state of the art semiconductor package 100 having an embedded interconnection bridges connecting multiple dies 102A and 102B in accordance with example embodiments of the disclosure. The semiconductor package 100 includes a first logic die 102A (e.g., a memory die) and a second logic die 102B (e.g., a CPU or SoC die) coupled to an interposer 106 through a patch structure 108 having one or more bridge dies 110A and 110B, such as one or more embedded interconnection bridges (EMIBs). The first and second logic dies 102A and 102B are collectively referred to herein as logic dies 102, and the bridge dies 110A and 110B are collectively referred to herein as bridge dies 110.

The patch structure 108 may include a core 120 with at least one build-up layer 122 provided over the core 120. Although a single build-up layer 122 between the core 120 and the bridge dies 110 is shown here, it will be appreciated that there may be any suitable number of build-up layers between the core 120 and the bridge dies 110.

The bridge dies 110 are small silicon chips embedded in the substrate of the patch structure 108 that provide dedicated ultra-high-density interconnects between logic dies 102. The bridge dies 110 may or may not have through-silicon vias (TSVs), for example, the first bridge die 110A is shown without a TSV and the second EMIB 110B is shown with a TSV. In one embodiment, the interposer 106 may comprise ajinomoto-build-up-film (ABF) material for TSVs having improved signal integrity and lower cost than that of conventional TSVs.

The logic dies 102 are connected to the patch structure 108 (and to the bridge dies 110) through micro-bumps 112A and 112B of the first and second logic die 102A and 102B, and bond pads 116 of the patch structure 108. In one embodiment, microbumps 112A may be referred to as bridge bumps, while microbumps 112B may be referred to as large pitch bumps (microbumps 112A and 112B are collectively referred to herein as bumps 112). The interconnection between the logic dies 102 and the patch structure 108 (and to the bridge dies 110) through the bumps 112 and bond pads 116 may be referred to as a first layer interconnect (FLI). In one embodiment, the bumps 112 may comprise plated copper or tin. The patch structure 108, in turn, is connected to the interposer 106 through large (e.g., flip chip) bumps 118. The interconnection between the patch structure 108 and the interposer 106 through the large bumps 118 may be referred to as a second level interconnect.

Of particular importance is limiting variation in the thickness of the micro-bumps 112. Future generation EMIB substrate micro-bump pitching is trending to be as small as 30 um to meet the projected I/O density requirement, which translates into a stringent micro-bump thickness variation (BTV) requirement of the first layer interconnect (FLI) for the logic die 102 attach process. The patch structure 108 with the bridge dies 110 between the interposer 106 and the logic dies 102 aims to achieve the BTV requirement for the first layer interconnect having mixed bump pitching, as shown in FIG. 1. Typically, a polishing step is used to flatten the surface of the top build up layer(s) of the patch 108 prior to formation of the bond pads 116 and attachment of the logic dies 102 onto the bond pads 116 using the bumps 112.

The use of the patch structure 108 and bridge dies 110 decouples the patch panel thickness variation through many build up layers 122 and isolates the FLI BTV to a couple of layers in the patch structure 108. However, the FLI in this approach is still created on top of a few build up layers 122 of plated metal and dielectric, and thus multiple steps of panel level planarization might be needed, which is an expensive and is a still-in-development process. Even on a flat polished surface it is still hard to achieve uniform plated copper or tin bump 112 height in the FLI due to the nature of the variation of via recess and the metal density difference between regions with different bump pitches on the FLI layer. In addition, current process flows need relatively long processing steps on temporal carriers before the assembly process, adding complexity to manufacturing process and requirement on the temporal carrier.

In accordance with one or more embodiments, a semiconductor package structure having a FLI first on carrier architecture is disclosed in which the FLI layer is the created first against a very smooth glass carrier, and thus automatically enables a bump surface that is as flat as the carrier surface itself. The flat surface of the glass carrier can provide very accurate control of the solder volume on the bumps, greatly reducing one major contributor of the BTV variations. In a second aspect, the bridge die are flipped and placed face down using solder for connections. This relaxes the overlay budget since there no lithography-to-die overlay in subsequent steps.

Figure 2:
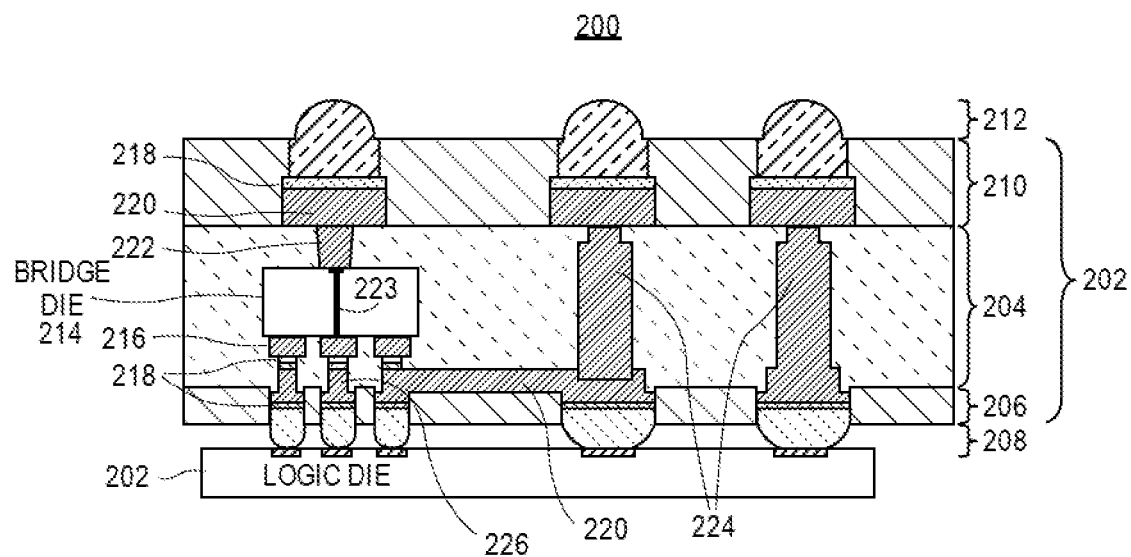
FIG. 2 depicts a simplified cross-sectional schematic diagram illustrating a patch structure of an integrated circuit package having a first layer interconnect (FLI) first on a glass carrier architecture in accordance with the example embodiments of the disclosure.

FIG. 2 depicts a simplified cross-sectional schematic diagram illustrating a patch structure 200 of an integrated circuit package having a first layer interconnect (FLI) first on a glass carrier architecture in accordance with the example embodiments of the disclosure.

The patch structure 200 may be referred to as being inverted because the patch connects to one or more logic die 202 from the bottom and connects to a substrate (not shown), such as an interposer, from the top. The patch structure 200 comprises a core 204 having a first side facing downwards and a second side facing upwards. A first solder resist (SR) layer 206 is formed on the first side of the core 204. The first SR layer 206 comprises the first layer interconnect (FLI) and has a first set of one or more microbumps 208 thereon to bond to one or more of the logic die 202. A second solder resist (SR) layer 210 is formed on the second side of the core 204. The second SR layer 210 has a second set of one or more microbumps 212 thereon to bond with a substrate (not shown), such as an interposer. One or more bridge dies 214 having a set of bumps 216 may be disposed flipped over within the core 204 such that the set of bumps 216 faces downward and connects to the first set of one or more microbumps 208 in the FLI.

Surface finish metal 218 and at least one of conductive contacts/traces 220 and pillars 226 in the first and second SR layers 206, 210 and the core 204 may be used to form connections between the set of bumps 216 of the bridge die 214 and the first set of microbumps 208 in the FLI. In one embodiment, the surface finish metal 218 may comprise nickel or tin or combination thereof, and the contacts 220 and pillars 226 comprise plated copper.

The bridge die 214 is shown with a via 222 formed inside the substrate dielectric (e.g., by laser drill), which connects to contact 220. The bridge die 214 may further include an optional through-silicon via (TSV) (not shown) on the top surface opposite the set of bumps 216 to connect with the second set of one or more microbumps 212. The bridge die 214 may optionally include an TSV 223 that connects to substrate routing or the microbumps 212 through a via 222 formed inside the dielectric (e.g, by laser drill). Portions of the first and second set of microbumps 208, 212 may be directly connected through a combination of the surface finish metal 218, contacts 220 and pillars 224 extending through the core 204. In one embodiment, there may be one or more routing layers between the second SR layer 210 and the core 204.

In one embodiment, the first and second SR layers 206, 210 have different thicknesses. In one embodiment, the second SR 210 layer has a thickness greater than the first SR layer 206. Some planarization might still be needed to ensure the first and second SR layers 206, 210 to stay parallel to each other after copper plating, but planarization is no longer needed for bump solder volume control.

Because the bridge die 214 and its surface finish metal is formed first on a glass carrier, as described below, a primary benefit of the patch architecture is that the FLI's surface finish metal 218 can be created with very precise volume control. In one embodiment, the surface finish metal 218 of the first SR layer 206 (i.e., the FLI) has a bump thickness variation (BTV) that meets a thickness variation of a glass carrier on which the bridge die 214 and the surface finish metal 218 of the first SR layer 206 are formed. In one embodiment, the attachment of the bridge die 214 to pillars 226 within the core 204 is performed by a thermal compressive bonding process (TCB), which also requires good BTV as well. As the pillars 226 connecting the bridge die 214 are only two conformal plating layers away from the flat glass carrier, low BTV is maintained during the bridge die attach step (the small bridge die size also contributes).

The bridge die 214 is placed facing down and no subsequent lithography step is needed to overlay the bridge die 214 against the set of bumps 218. As a result, placement accuracy problem for the bridge die 214 can be simplified from quarter panel to multiple bridge dies 214 to a single bridge die 214 to a local lithography region. In addition, the solider process during the bridge die 214 TCB process may have a lessor placement accuracy requirement than using the build-up process.

The patch architecture may include the TSV in the flow if needed since vias to the TSV can be created using the established laser via BU process after the molding step. In the patch architecture shown in FIG. 2 the vias for TSV pillars can only be added after glass carrier removal and a temporary carrier is needed.

Although not shown, the patch structure 200 may, in example embodiments, include one or more interconnect layers in at least one of the sides of the core 204. That is, the second SR layer 210 and/or the first SR layer 206 may have interconnects formed therein. The interconnects may provide electrical pathways for signals between electronic components (e.g., integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like.

As an exemplary processing scheme involving fabrication of a patch structure of an integrated circuit package having a first layer interconnect (FLI) first on a glass carrier architecture, refer to the following Figures illustrating views of various stages in a method of fabricating a vertical memory array integrate circuit structure in accordance with an embodiment of the present disclosure.

Figure 3A:
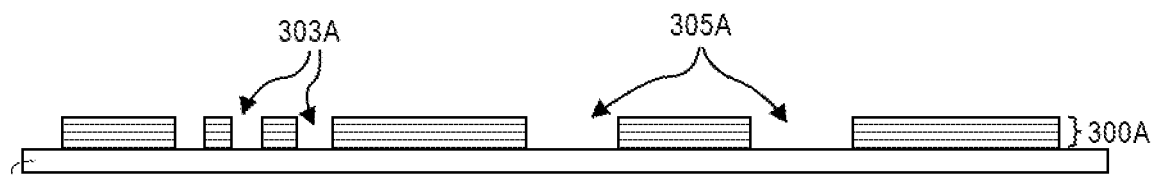
FIGS. 3A-3N illustrate a method for fabricating a patch structure of an integrated circuit package having a first layer interconnect (FLI) first on a glass carrier architecture.
Figure 3B:
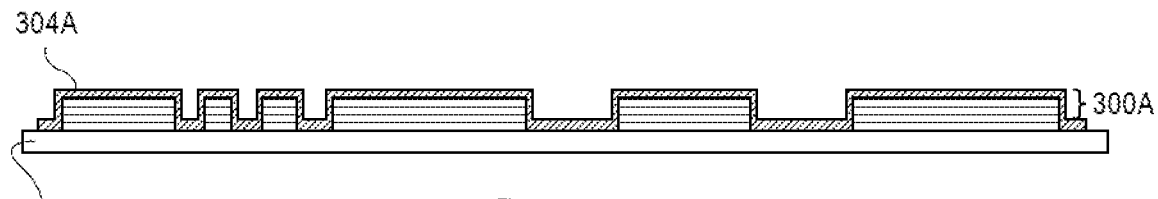
Figure 3C:
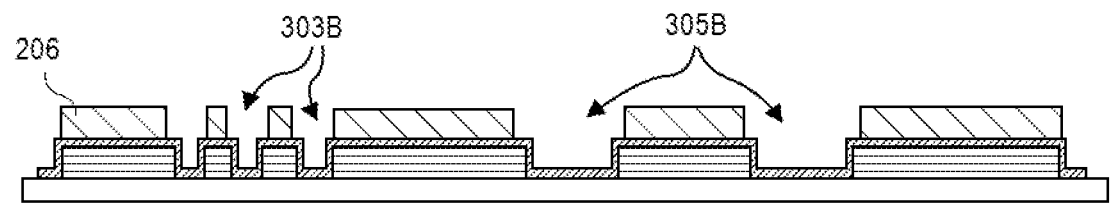
Figure 3D:
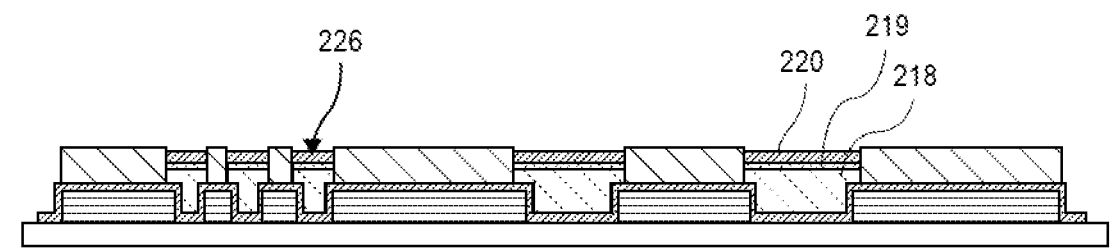
Figure 3E:
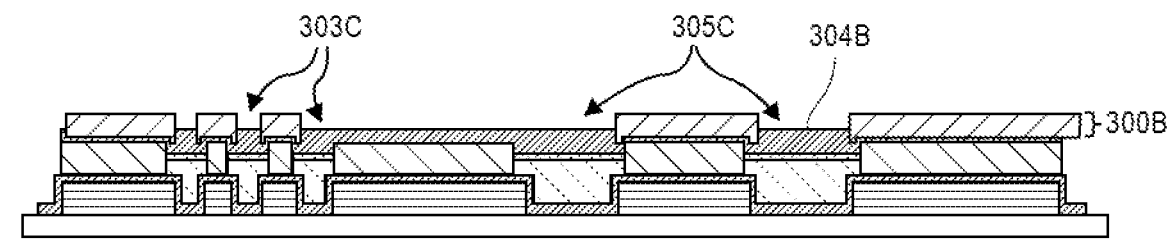
Figure 3F:
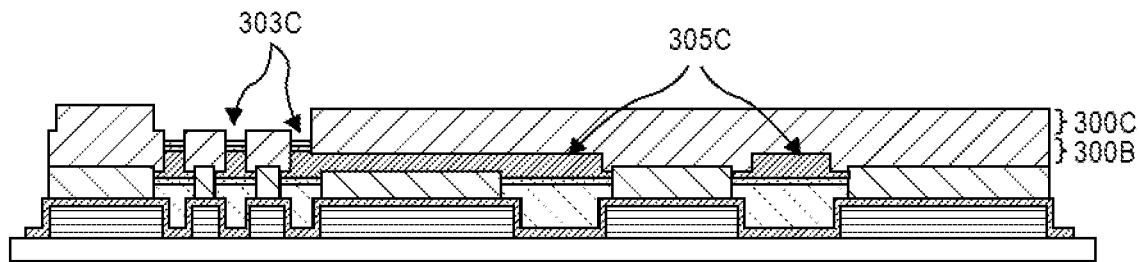
Figure 3G:
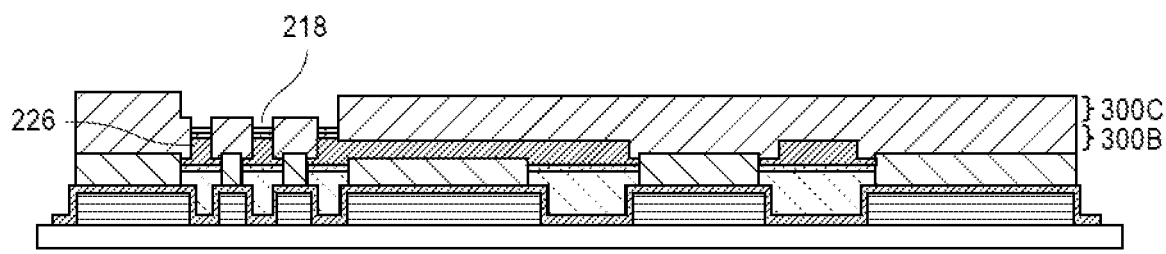
Figure 3H:
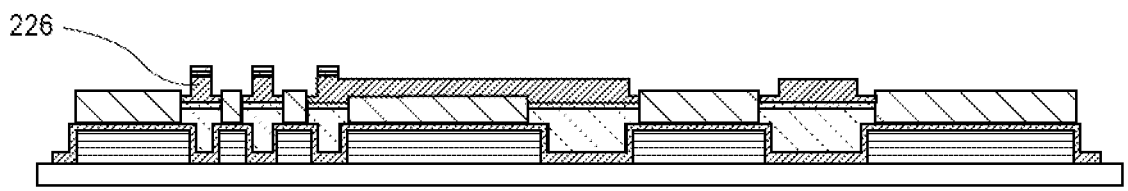
Figure 3I:
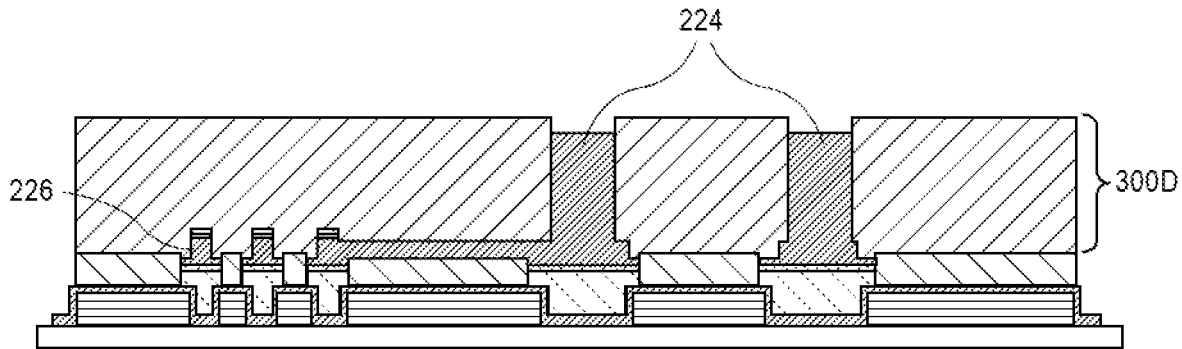
Figure 3J:
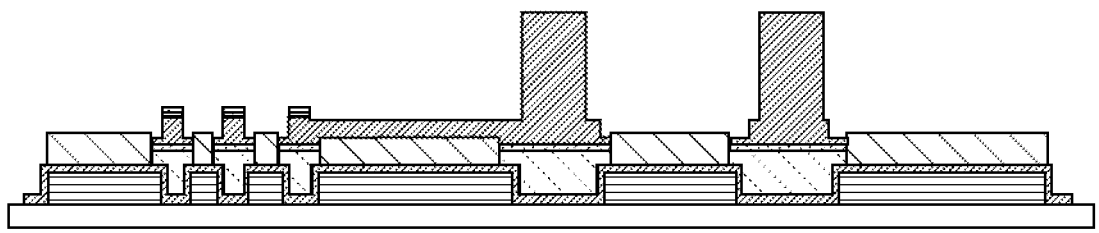
Figure 3K:
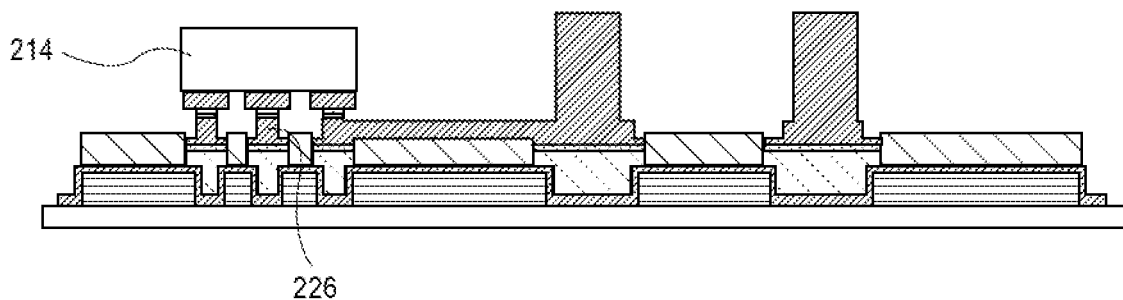
Figure 3L:
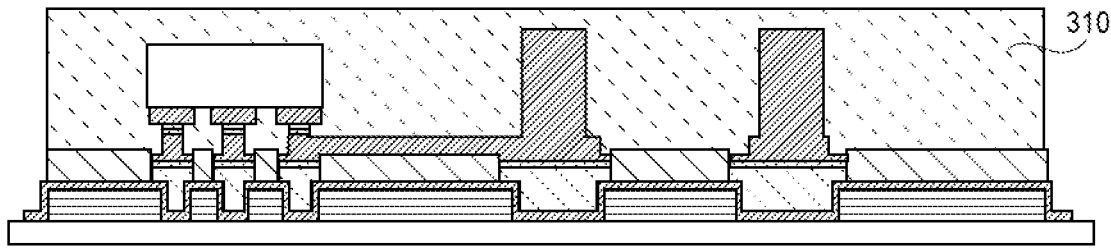
Figure 3M:
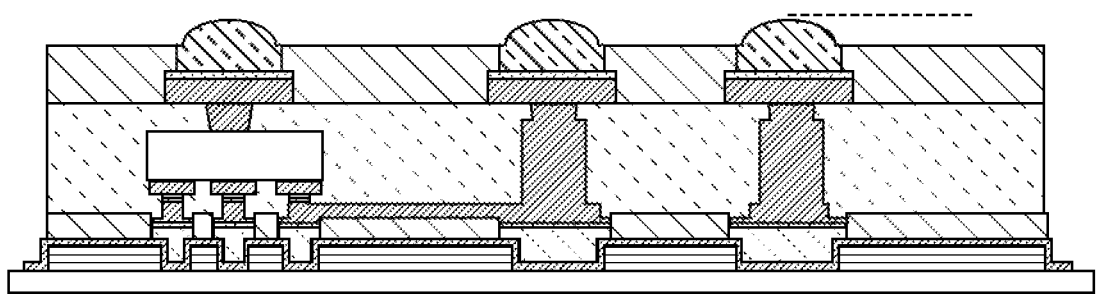
Figure 3N:
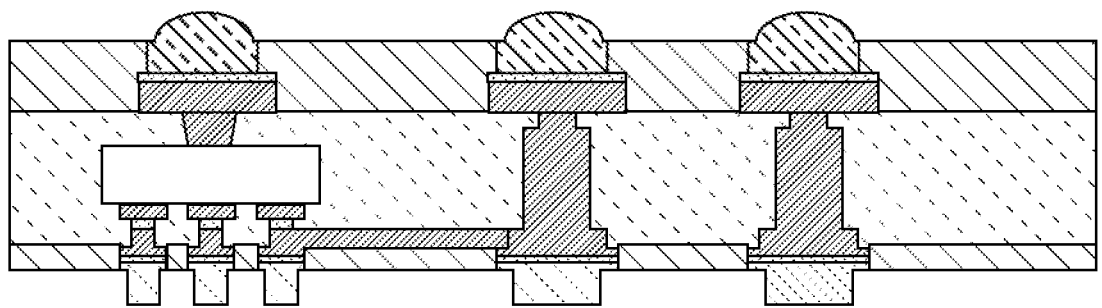

FIGS. 3A-3N illustrate a method for fabricating a patch structure 200 of an integrated circuit package having a first layer interconnect (FLI) first on a glass carrier architecture (as shown in FIG. 2). In one embodiment, the patch structure 200 may be formed using, for example, a double lithography patterning process (or a double lithography patterning/plating process). As used herein, the "double lithography patterning process" refers to a first photoresist deposited and patterned over a seed layer (i.e., a first litho-plate), and a second photoresist deposited and patterned over the first photoresist (i.e., a second litho-plate).

Referring now to FIG. 3A, a method of fabricating the patch structure having a FLI first on a glass carrier may begin by depositing and patterning a first layer of photoresist 300A, e.g., dry film resist (DFR), over a glass carrier 302 having a releasing film thereon. In one embodiment, the patterning of first layer of photoresist 300A may be implemented with lithographic patterning processes (e.g., exposed with a radiation source through a routing layer mask (not shown) and developed with a developer). The pattern of the first layer of photoresist 300A leaves a first set of openings 303A, 305A defining locations for connections with the logic die and other structures. In one embodiment, one set of small openings 303A are locations for bridge bumps, while a second set of larger openings 305A are locations for large pitch bumps and traces.

FIG. 3B illustrates formation of a seed layer 304A is deposited conformal with the first layer of patterned photoresist 300A. In one embodiment, seed layer 304 may comprise a titanium, copper (Ti/Cu) seed layer that is sputtered.

FIG. 3C illustrates a first solder resist (SR) layer 206 deposited and patterned over the seed layer 304A, with a set of openings 303B, 305B that are aligned with, and slightly larger than, openings 303A, 305A formed by the photoresist 300A.

FIG. 3D illustrates a surface finish metal 218, such as tin is deposited in the first set of openings 303A, 305A and the second set of openings 303B, 305B followed by thin layer of nickel 219. Once the nickel/tin 218, 219 is plated, then a conductive material, e.g., copper 220, is deposited to form contacts and/or pillars 226. In one embodiment, the conductive material may be formed with a copper electroplating process, sputtered copper, or the like.

FIG. 3E illustrates that round of seed-litho-plating is performed in which another seed layer 304B is deposited in the openings 303C, 305C, followed by deposition and patterning of a second layer of photoresist 300B, e.g., DFR, to form a third set of openings 303C, 305C over the contacts and/or pillars 226, to and define locations for traces, followed by conductive material (e.g., copper) plating. In one embodiment, seed layer 304B may comprise a titanium, copper (Ti/Cu) seed layer that is sputtered.

FIG. 3F illustrates that without stripping, a third layer of photoresist 300C, e.g., DFR, is laminated and patterned over the second layer of photoresist 300B, blocking openings defining locations 305C for the large pitch bumps and traces, while leaving openings defining locations 303C for the bridge bumps uncovered.

FIG. 3G illustrates that a layer of surface finish metal 218 (e.g., nickel/tin) is plated over the uncovered locations 303C of the bridge bumps, completing formation of bridge bumps pillars 226.

FIG. 3H illustrates that the second and third layers of photoresist 300B, 300C are stripped, exposing the seed layer 304B and the bridge bumps pillars 226.

FIG. 3I illustrates pillar 224 formation over locations 305C for the large pitch bumps in which a fourth layer of photoresist 300D that is thicker than a combination of the second and third layers of photoresist 300B, 300C is laminated and patterned over the second C layer and the bridge bumps pillars 226. In one embodiment, the thickness of the fourth layer of photoresist 300D must be greater than a thickness of the bridge die. The fourth layer of photoresist 300D blocks locations 303C of the bridge bumps pillars 226, while leaving locations 305C for the large pitch bumps uncovered. Conductive material is deposited in the openings of locations 305C for the large pitch bumps to form pitch bump pillars 224.

FIG. 3J shows that after stripping of the thick fourth layer of photoresist 300D.

FIG. 3K illustrates attachment of bridge die 214 to bridge die pillars 226 by a thermal compression bonding (TCB) process, which requires good BTV. The bridge die 214 is attached facing down and no subsequent lithography step is needed to overlay the bridge die 214 against the bridge die pillars 226. As a result, placement accuracy problem for the bridge die 214 can be simplified from quarter panel to multiple bridge dies 214 to a single bridge die 214 to a local lithography region.

FIG. 3L shows a thick layer of dielectric 310 is applied to the patch structure, which can be under fill plus Ajinomoto build-up films (ABF) lamination or through mold.

FIG. 3M illustrates that subsequent steps of the process would be the same as a normal substrate build up and surface finish process. Here only the laser drilling, N−1 copper patterning and SR and microbump surface finish are shown.

FIG. 3N illustrates that the glass carrier is debonded and a temporary carrier (not shown) is attached to the patch structure. The first layer of photoresist is stripped and the initial seed layer etched. A reflow for the plated tin bump is the final step that will round the plated tin bump (not shown). In one embodiment, the large bottom bumps can be replaced with microballs.

As stated above, as a result of the fabrication process described above, the surface finish metal 218 of the first SR layer 206 (i.e., the FLI) has a bump thickness variation (BTV) that meets a thickness variation of a glass carrier 302 on which the bridge die 214 and the surface finish metal 218 of the first SR layer 206 are formed.

There can be architectural variations of the embodiment of the bridge die facing down with FLI fabricated first on a glass carrier. In one example embodiment, bumps in relaxed pitch areas in the FLI can be achieved by replacing the bumps with microballs and adding one additional lithography and etch steps. The resulting architecture would look the same as shown in FIG. 2 but the larger solder in the bottom layer are from microballs, rather than plated tin bumps. If the patch thickness variation can be controlled to a very low value, the FLI layer can be simplified even further as shown in FIG. 4A and FIG. 4B where a non-solder surface finish is used.

Figure 4A:
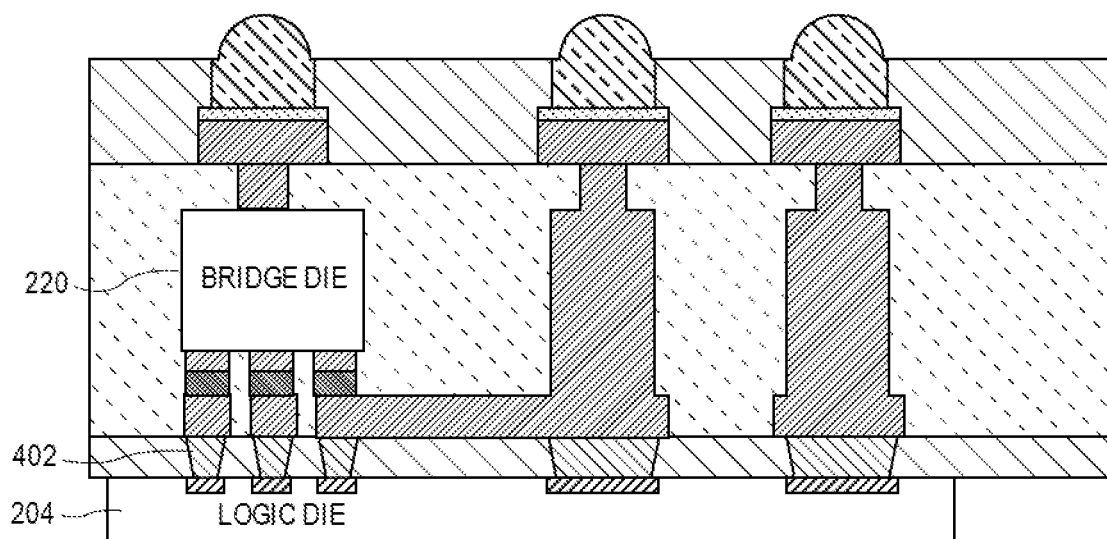
FIG. 4A depicts a simplified cross-sectional schematic diagram illustrating a patch structure of an integrated circuit package having a first layer interconnect (FLI) first on a glass carrier architecture to a second embodiment.

FIG. 4A depicts a simplified cross-sectional schematic diagram illustrating a patch structure 400 of an integrated circuit package having a first layer interconnect (FLI) first on a glass carrier architecture to a second embodiment. In one embodiment, the microbumps 208 (FIG. 2) in the FLI can be replaced by solder 402 if the thickness of the patch structure 400 is not a concern. However, some solder on the logic die may still needed since the surface may not be perfectly flat.

Figure 4B:
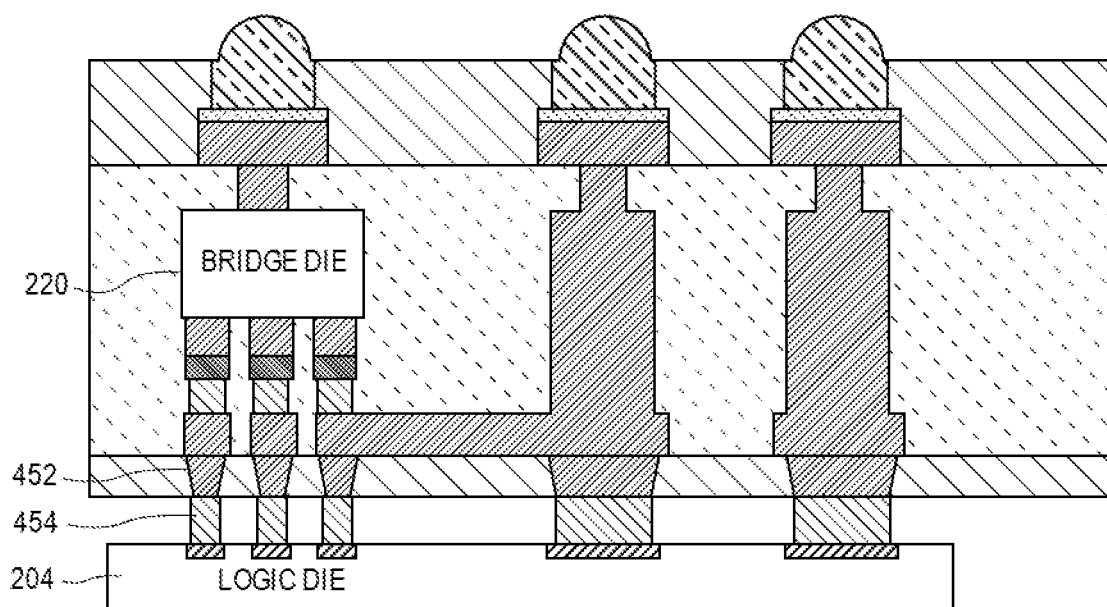
FIG. 4B depicts a simplified cross-sectional schematic diagram illustrating a patch structure of an integrated circuit package having a first layer interconnect (FLI) first on a glass carrier architecture to a third embodiment.

FIG. 4B depicts a simplified cross-sectional schematic diagram illustrating a patch structure 450 of an integrated circuit package having a first layer interconnect (FLI) first on a glass carrier architecture to a third embodiment. The third embodiment shows that the microbumps 208 (FIG. 2) in the FLI can be replaced with different non-solder surface finishes if patch thickness variation can be controlled. For example, in one embodiment the microbumps may be replaced with copper 452 that is covered with organic surface protection (OSP) 454. Other materials other than copper may also be used such as nickel and palladium, for example. In one embodiment, the connection between the surface finish metal in the SR layer and the logic die may require some amount of solder that is already present on the logic die.

Figure 5:
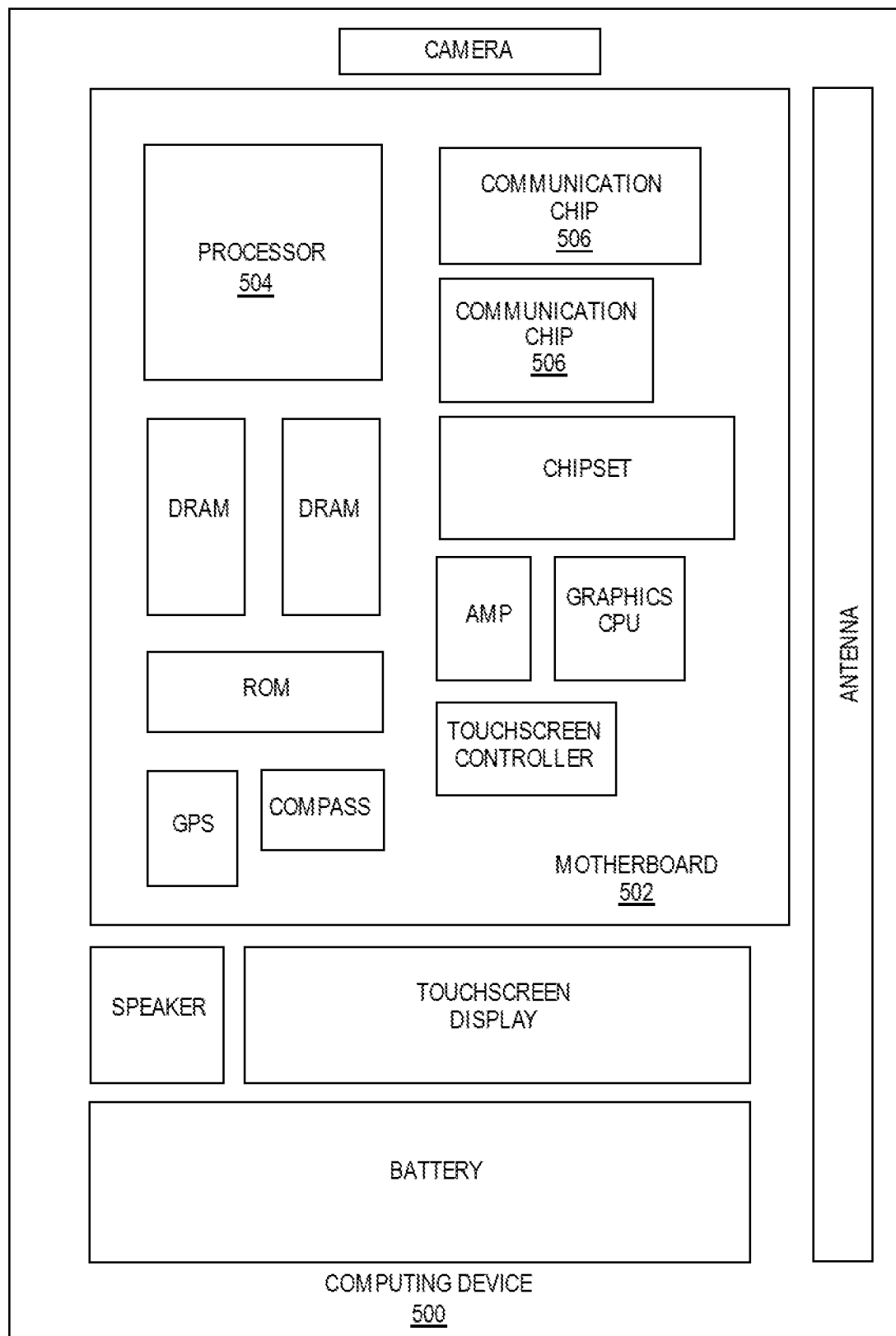
FIG. 5 illustrates a computing device in accordance with one implementation of the disclosure.

FIG. 5 illustrates a computing device 500 in accordance with one implementation of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the disclosure, the integrated circuit die of the processor includes one or more thin film transistors having relatively increased width, in accordance with implementations of embodiments of the disclosure. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of embodiments of the disclosure, the integrated circuit die of the communication chip includes one or more thin film transistors having relatively increased width, in accordance with implementations of embodiments of the disclosure.

In further implementations, another component housed within the computing device 500 may contain an integrated circuit die that includes one or more thin film transistors having relatively increased width, in accordance with implementations of embodiments of the disclosure.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments described herein include thin film transistors having relatively increased width.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A patch structure of an integrated circuit package comprises a core having a first side facing downwards and a second side facing upwards. Forming a first solder resist (SR) layer on the first side of the core, wherein the first SR layer comprises a first layer interconnect (FLI) and has a first set of one or more microbumps thereon to bond to one or more logic die. Forming a second solder resist (SR) layer on the second side of the core, wherein the second SR layer has a second set of one or more microbumps thereon to bond with a substrate. One or more bridge dies includes a respective sets of bumps, wherein the one or more bridge dies is disposed flipped over within the core such that the respective sets of bumps face downward and connect to the first set of one or more microbumps in the FLI.

Example embodiment 2: The patch structure of embodiment 1, further including surface finish metal and at least one of contacts and pillars in the first SR layer, the second SR layer, and the core to form connections between the respective set of bumps of the one or more bridge dies and the first set of one or more microbumps in the FLI.

Example embodiment 3: The patch structure of embodiment 1 or 2, wherein the surface finish metal comprises at least one of nickel and tin or a combination thereof, and the contacts and pillars comprise plated copper.

Example embodiment 4: The patch structure of embodiment 1, 2 or 3, wherein the surface finish metal of the first SR layer has a bump thickness variation to meet a thickness variation of a glass carrier on which the surface the one or more bridge dies and the surface finish metal of the first SR layer are formed.

Example embodiment 5: The patch structure of embodiment 1, 2, 3, 4 or 5, wherein the one or more bridge dies further includes a through-silicon via (TSV) to connect with the second set of one or more microbumps on the second SR layer.

Example embodiment 6: The patch structure of embodiment 1, 2, 3, 4, 5 or 6, wherein portions of the first set of microbumps and the second set of microbumps are directly connected using a combination of the surface finish metal, contacts, and pillars.

Example embodiment 7: The patch structure of embodiment and 1, 2, 3, 4, 5, or 6, wherein the surface finish metal comprises at least one of nickel and tin or a combination thereof, and the contacts and pillars comprise plated copper.

Example embodiment 8: The patch structure of embodiment 1, 2, 3, 4, 5, 6, or 7, wherein the one or more bridge dies further includes a through-silicon via (TSV) to connect with the second set of one or more microbumps on the second SR layer.

Example embodiment 9: The patch structure of embodiment 1, 2, 3, 4, 5, 6, 7, or 8, wherein the second SR layer has a greater thickness than the first SR layer.

Example embodiment 10: The patch structure of embodiment 1, 2, 3, 4, 5, 6, 7, 8, or 9, further including one or more interconnect layers in at least one of the second SR layer and the first SR layer.

Example embodiment 11: The patch structure of embodiment 1, 2, 3, 4, 5, 6, 7, 8, 9, or 10, further including attaching the bridge die to pillars within the core by a thermal compressive bonding process (TCB).

Example embodiment 12: A method of fabricating a patch structure comprises forming a core having a first side facing downwards and a second side facing upwards. A first solder resist (SR) layer is formed on the first side of the core, the first SR layer comprising a first layer interconnect (FLI) and having a set of connectors thereon to bond to one or more logic die. A second solder resist (SR) layer is formed on the second side of the core, the second SR layer having a set of one or more microbumps thereon to bond with a substrate. One or more bridge dies having respective sets of bumps are disposed flipped over within the core such that the respective sets of bumps face downward and connect to the set of connectors in the FLI.

Example embodiment 13: The embodiment of claim 12, wherein the set of connectors in the FLI comprise a first set of microbumps, and the set of microbumps in the second SR layer comprise a second set of microbumps.

Example embodiment 14: The embodiment of claim 12 or 13, further comprising forming the set of connectors in the FLI using solder.

Example embodiment 15: The embodiment of claim 12, 13, or 14, further comprising forming the set of connectors in the FLI using a non-solder surface finish including copper covered with organic surface protection (OSP).

Example embodiment 16: The embodiment of claim 12, 13, 14, or 15, further comprising forming surface finish metal and at least one of contacts and pillars in the first SR layer, the second SR layer, and the core to form connections between the respective set of bumps of the one or more bridge dies and the first set of one or more microbumps in the FLI.

Example embodiment 17: The embodiment of claim 13, 14, 15, or 16, further comprising forming the surface finish metal using at least one of nickel and tin or a combination thereof, and forming the contacts and pillars using plated copper.

Example embodiment 18: The embodiment of claim 13, 14, 15, 16, or 17, further comprising forming the surface finish metal of the first SR layer with a bump thickness variation to meet a thickness variation of a glass carrier on which the surface the one or more bridge dies and the surface finish metal of the first SR layer are formed.

Example embodiment 19: A method of fabricating a patch structure comprises forming a first layer of photoresist over a glass carrier, wherein the first layer of photoresist leaves openings a first set of openings defining locations for connections with logic die. A first seed layer is formed is deposited conformal with the first layer of patterned photoresist. A first solder resist (SR) layer over is formed the first seed layer, wherein the first SR layer has a second set of openings that are aligned with the first set of openings formed by the first layer photoresist. A surface finish metal is deposited followed by a conductive material in the first set of openings and the second set of openings, and plating the conductive material with surface finish metal to form contacts and pillars. A second seed layer is deposited in the third set of openings and a second layer of photoresist is formed over a glass carrier, wherein the second layer of photoresist leaves a third set of openings over the contacts and pillars, followed by conductive material plating. A third layer of photoresist is formed over the second layer photoresist, wherein the third layer photoresist blocks openings defining locations for pitch bumps and traces, while leaving openings defining locations for bridge bumps uncovered. A second layer of surface finish metal is formed in the openings defining locations for bridge bumps to form bridge bumps pillars. The second layer of photoresist and the third layer photoresist are stripped to expose the second layer and the bridge bumps pillars. A fourth layer photoresist is formed over the second seed layer and the bridge bumps pillars, leaving openings for the locations of the pitch bumps. A conductive material is deposited in the openings for the locations of the pitch bumps to form pitch bump pillars. The fourth layer of photoresist is stripped. At least one bridge die is attached facing down onto the bridge die pillars, followed by formation of a dielectric layer over the patch structure. A substrate buildup and surface finish process is performed, including conductive material patterning and SR and microbump surface finish. The glass carrier is debonded and the patch structure is attached to a temporary carrier, the first layer photoresist is stripped.

Example embodiment 20: The embodiment of claim 19, further comprising forming a releasing film on the glass carrier.

Example embodiment 21: The embodiment of claim 19 or 20, wherein the openings further comprise one set of openings for the bridge bumps and a second set of openings for large pitch bumps and traces.

Example embodiment 22: The embodiment of claim 19, 20, or 21, wherein the third layer photoresist leaves a set of openings defining locations the bridge bumps uncovered.

Example embodiment 23: The embodiment of claim 19, 20, 21 or 22, further comprising forming the first seed layer conformal with the first layer of patterned photoresist.

Example embodiment 24: The embodiment of claim 19, 20, 21, 22, or 23, wherein the first seed layer and the second seed layer comprise at least one of titanium and copper.

Example embodiment 25: The embodiment of claim 19, 20, 21, 23, or 24, wherein the conductive material comprises copper, and the surface finish metal comprises at least one of nickel and tin.

What is claimed is:

1. A semiconductor package, comprising:
   a first bridge die having a top, a bottom, a first side between the top and bottom, and a second side between the top and bottom, the second side opposite the first side, the first bridge die having a vertical thickness between the top and bottom, and the first bridge die having a plurality of through vias;
   a second bridge die laterally spaced apart from the first bridge die, the second bridge die having a top, a bottom, a first side between the top and bottom, and a second side between the top and bottom, the second side opposite the first side, the second bridge die having a vertical thickness between the top and bottom, and the second bridge die having a plurality of through vias;
   a core material laterally adjacent to and in contact with the first side and the second side of the first bridge die, the core material on and vertically overlapping with a portion of the top of the first bridge die, the core material laterally adjacent to and in contact with the first side and the second side of the second bridge die, and the core material on and vertically overlapping with a portion of the top of the second bridge die;
   a first conductive pillar laterally adjacent to the first side of the first bridge die, wherein the first conductive pillar extends through the core material;
   a second conductive pillar laterally adjacent to the second side of the first bridge die, wherein the second conductive pillar extends through the core material;
   a build-up layer over the core material, the build-up layer over the first bridge die, over the second bridge die, over the first conductive pillar, and over the second conductive pillar, and the build-up layer having an uppermost surface;
   a first die over a first portion of the build-up layer, the first die coupled to the first bridge die and to the first conductive pillar by the first portion of the build-up layer, and the first die having a bottommost surface above the uppermost surface of the build-up layer, wherein the first bridge die is partially within a footprint of the first die; and
   a second die over a second portion of the build-up layer, the second die coupled to the first bridge die and to the second conductive pillar by the second portion of the build-up layer, and the second die having a bottommost surface above the uppermost surface of the build-up layer, wherein the first bridge die is partially within a footprint of the second die, and the second bridge die is coupled to the second die and is partially within the footprint of the second die.

2. The semiconductor package of claim 1, wherein the build-up layer is directly on the core material.

3. The semiconductor package of claim 2, wherein the build-up layer comprises a conductive trace, the conductive trace directly coupling the first bridge die to one of the first conductive pillar or the second conductive pillar.

4. The semiconductor package of claim 1, wherein the core material is further along the bottom of the first bridge die and along the bottom of the second bridge die.

5. The semiconductor package of claim 1, wherein the core material is further along the top of the first bridge die and along the top of the second bridge die.

6. The semiconductor package of claim 1, wherein the core material is further along the bottom of the first bridge die and along the bottom of the second bridge die, and wherein the core material is further along the top of the first bridge die and along the top of the second bridge die.

7. The semiconductor package of claim 1, wherein the first die extends laterally beyond the first side of the first bridge die.

8. The semiconductor package of claim 7, wherein the second die extends laterally beyond the second side of the first bridge die.

9. A semiconductor package, comprising:
- a first bridge die having a top, a bottom, a first side between the top and bottom, and a second side between the top and bottom, the second side opposite the first side, the first bridge die having a vertical thickness between the top and bottom, and the first bridge die having a plurality of through vias;
- a second bridge die laterally spaced apart from the first bridge die, the second bridge die having a top, a bottom, a first side between the top and bottom, and a second side between the top and bottom, the second side opposite the first side, the second bridge die having a vertical thickness between the top and bottom, and the second bridge die having a plurality of through vias;
- a core material laterally adjacent to the first side and the second side of the first bridge die, the core material on and vertically overlapping with the first bridge die, the core material laterally adjacent to the first side and the second side of the second bridge die, and the core material on and vertically overlapping with the second bridge die;
- a first conductive pillar laterally adjacent to the first side of the first bridge die, wherein a first portion of the core material is between the first conductive pillar and the first side of the first bridge die, the first portion of the core material in contact with the first conductive pillar, wherein the first conductive pillar has a vertical thickness greater than the vertical thickness of the first bridge die, and wherein the vertical thickness of the first conductive pillar extends along an entirety of the vertical thickness of the first bridge die to a first location above the top of the first bridge die;
- a second conductive pillar laterally adjacent to the second side of the first bridge die, wherein a second portion of the core material is between the second conductive pillar and the second side of the first bridge die, the first portion of the core material in contact with the first conductive pillar, wherein the second conductive pillar has a vertical thickness greater than the vertical thickness of the first bridge die, and wherein the vertical thickness of the second conductive pillar extends along an entirety of the vertical thickness of the first bridge die to a second location above the top of the first bridge die;
- a build-up layer over the core material, the build-up layer over the first bridge die, over the second bridge die, over the first conductive pillar, and over the second conductive pillar, and the build-up layer having an uppermost surface;
- a first die over a first portion of the build-up layer, the first die coupled to the first bridge die and to the first conductive pillar by the first portion of the build-up layer, and the first die having a bottommost surface above the uppermost surface of the build-up layer, wherein the first bridge die is partially within a footprint of the first die; and
- a second die over a second portion of the build-up layer, the second die coupled to the first bridge die and to the second conductive pillar by the second portion of the build-up layer, and the second die having a bottommost surface above the uppermost surface of the build-up layer, wherein the first bridge die is partially within a footprint of the second die, and the second bridge die is coupled to the second die and is partially within the footprint of the second die.

10. The semiconductor package of claim 9, wherein the core material is in contact with the first side and the second side of the first bridge die and with the first side and the second side of the second bridge die.

11. The semiconductor package of claim 9, wherein the core material is on a portion of the top of the first bridge die and on a portion of the top of the second bridge die.

12. The semiconductor package of claim 9, wherein the core material is in contact with the first side and the second side of the first bridge die and the first and second side of the second bridge die, and wherein the core material is on a portion of the top of the first bridge die and on a portion of the top of the second die.

13. The semiconductor package of claim 9, wherein the build-up layer is directly on the core material.

14. The semiconductor package of claim 13, wherein the build-up layer comprises a conductive trace, the conductive trace directly coupling the first bridge die to one of the first conductive pillar or the second conductive pillar.

15. The semiconductor package of claim 9, wherein the core material is further along the bottom of the first bridge die and along the bottom of the second bridge die, and the core material is further along the top of the first bridge die and along the top of the second bridge die.

16. The semiconductor package of claim 9, wherein the first die extends laterally beyond the first side of the first bridge die, and wherein the second die extends laterally beyond the second side of the first bridge die.

* * * * *